US009494646B2

United States Patent
Pratap et al.

(10) Patent No.: US 9,494,646 B2
(45) Date of Patent: Nov. 15, 2016

(54) METHOD FOR TESTING INTEGRATED CIRCUIT AND INTEGRATED CIRCUIT CONFIGURED TO FACILITATE PERFORMING SUCH A METHOD

(71) Applicant: Freescale Semiconductor, Inc., Austin, TX (US)

(72) Inventors: Divya Pratap, Chandler, AZ (US); Sung Jin Jo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 182 days.

(21) Appl. No.: 14/204,679

(22) Filed: Mar. 11, 2014

(65) Prior Publication Data

US 2015/0260785 A1    Sep. 17, 2015

(51) Int. Cl.
    *G01R 31/317*    (2006.01)
(52) U.S. Cl.
    CPC ... *G01R 31/31724* (2013.01); *G01R 31/31701* (2013.01)
(58) Field of Classification Search
    None
    See application file for complete search history.

(56) References Cited

U.S. PATENT DOCUMENTS

| 6,144,594 | A | 11/2000 | McClure |
| 7,181,359 | B2 | 2/2007 | Goyal |
| 8,327,199 | B1 | 12/2012 | Dastidat et al. |
| 2005/0154945 | A1* | 7/2005 | Haag .................. H03M 1/1076 714/724 |
| 2011/0208460 | A1* | 8/2011 | Schultz ................ G01D 18/008 702/104 |
| 2013/0198578 | A1 | 8/2013 | Chandel et al. |

* cited by examiner

*Primary Examiner* — Paresh Patel

(57) ABSTRACT

An integrated circuit, such as for example an application specific integrated circuit, as well as a method of testing such a circuit, are disclosed herein. In one example embodiment, the integrated circuit includes a plurality of pins including a power pin, a ground pin, and a first communication pin, a test mode circuit, and a communication circuit. The integrated circuit additionally includes a first switch connected to the first communication pin, where the first switch is configured to couple the first communication pin to either the test mode circuit or the communication circuit. The integrated circuit further includes a control circuit coupled to the first switch and configured to control whether the first switch is operated to couple the first communication pin to the test mode circuit or to the communication circuit based upon or in response to an operating mode.

15 Claims, 5 Drawing Sheets

METHOD FOR TESTING INTEGRATED CIRCUIT AND INTEGRATED CIRCUIT CONFIGURED TO FACILITATE PERFORMING SUCH A METHOD

CROSS-REFERENCE TO RELATED APPLICATIONS

STATEMENT REGARDING FEDERALLY SPONSORED RESEARCH OR DEVELOPMENT

1. Field of the Disclosure

The present disclosure relates to electrical circuits such as integrated circuits and, more particularly, to methodologies for testing such integrated circuits or other electrical circuits, as well as integrated circuits or other electrical circuits having features configured to facilitate the use of such testing methodologies.

2. Background of the Disclosure

Integrated circuits such as ASICs are typically tested post-production to ensure there are no faults within the circuitry before being packaged in a chip set. To be tested, integrated circuits are connected to a testing device, such as automated testing equipment (ATE) or an ATE unit, via dedicated test pins that are part of the integrated circuit. The ATE unit generates an analog, digital, and/or mechanical reference signal that is processed by the internal logic and circuitry of the integrated circuit. The ATE unit then measures and compares the response of the integrated circuit at the dedicated test pins to determine whether the integrated circuit has passed or failed the test.

Although testing via dedicated test pins allows for testing of integrated circuits, such conventional testing methodologies suffer from certain disadvantages. For example, integrated circuits having dedicated test pins typically require larger silicon die size for each integrated circuit to accommodate the test pins, thus increasing the production cost of each integrated circuit. Also, when testing multiple integrated circuits simultaneously, i.e., in parallel, the use of dedicated test pins limits the number of integrated circuits that are able to be tested by the ATE unit—a typical ATE unit has a fixed amount of channels that can have maximum values in terms of voltage and current requirements and, with every channel being connected to different pins of different devices, an increased numbers of pins can result in fewer devices being accommodated by the tester (also, a higher number of pins increases the package size, which lessens the number of parts that can be provided on a fixed dimension board). Additionally, the length of the testing process is further increased by the use of multiple dedicated test pins found in some integrated circuits.

For at least the above reasons, it would be advantageous if one or more new testing methodologies for electrical circuits such as integrated circuits, as well as integrated circuits (or other electrical circuits) configured to facilitate or suitable for such testing, could be developed that did not suffer from one or more of the above-discussed disadvantages or one or more other disadvantages.

DETAILED DESCRIPTION

The present inventors have recognized that it is possible to test integrated circuits (as well as possibly other electrical circuits) in manners in which the testing can be performed without the use of one or more—indeed, in at least some embodiments, without the use of any—dedicated test pin(s). The present inventors have also recognized that such testing, and integrated circuits (or other electrical circuits) lacking one or more dedicated test pin(s) and/or otherwise configured for being tested in such manners, are advantageous on one or more levels relative to conventional integrated circuits or conventional test methodologies. Among other things, with fewer external pins overall, the integrated circuits can have smaller die sizes. Also, if one or more (or even all) dedicated test pins can be eliminated from the integrated circuits, the integrated circuits can be tested with faster analog test times, and there can be achieved higher parallelism during testing of the integrated circuits (e.g., by way of an ATE unit), all of which help lower the production cost of each integrated circuit. Additionally, continuous quality improvement (CQI) can be aided by using less external pins and thus, with such arrangements, there is less chance for defects when manufacturing integrated circuits.

Therefore, at least some embodiments disclosed herein relate generally to testing integrated circuits (ICs) without one or more dedicated test pins (indeed, in at least some embodiments, without any dedicated test pins). Also, at least some embodiments described herein include an integrated circuit (IC) having four external connections, or pins, configured to be tested without a dedicated test pin, and/or a testing method in which there is activating and deactivating of a test mode by way of the four pin integrated circuit. Further, more particularly, at least some embodiments disclosed herein relate to testing application specific integrated circuits (ASIC) that have only four external pins, namely, a power pin, ground pin, and two serial communication pins, where the testing involves activating a test mode of the integrated circuit in which one or both of the communication pins operate as test pins. Although the term pin is employed herein as referring to an input/output (I/O) port (or as a structure serving as an I/O port or contact) of a circuit such as an IC, the use of this term is not intended to be limiting to structures that have specific characteristic(s) such as any particular shape or size and, indeed, the present disclosure is intended to apply to a variety of circuit assemblies and components having any of a variety of types of I/O ports (or structures serving as I/O ports or as contacts), and the use of the term pin is intended to broadly encompass a variety of such I/O ports, structures, and/or contacts.

Figure 1:
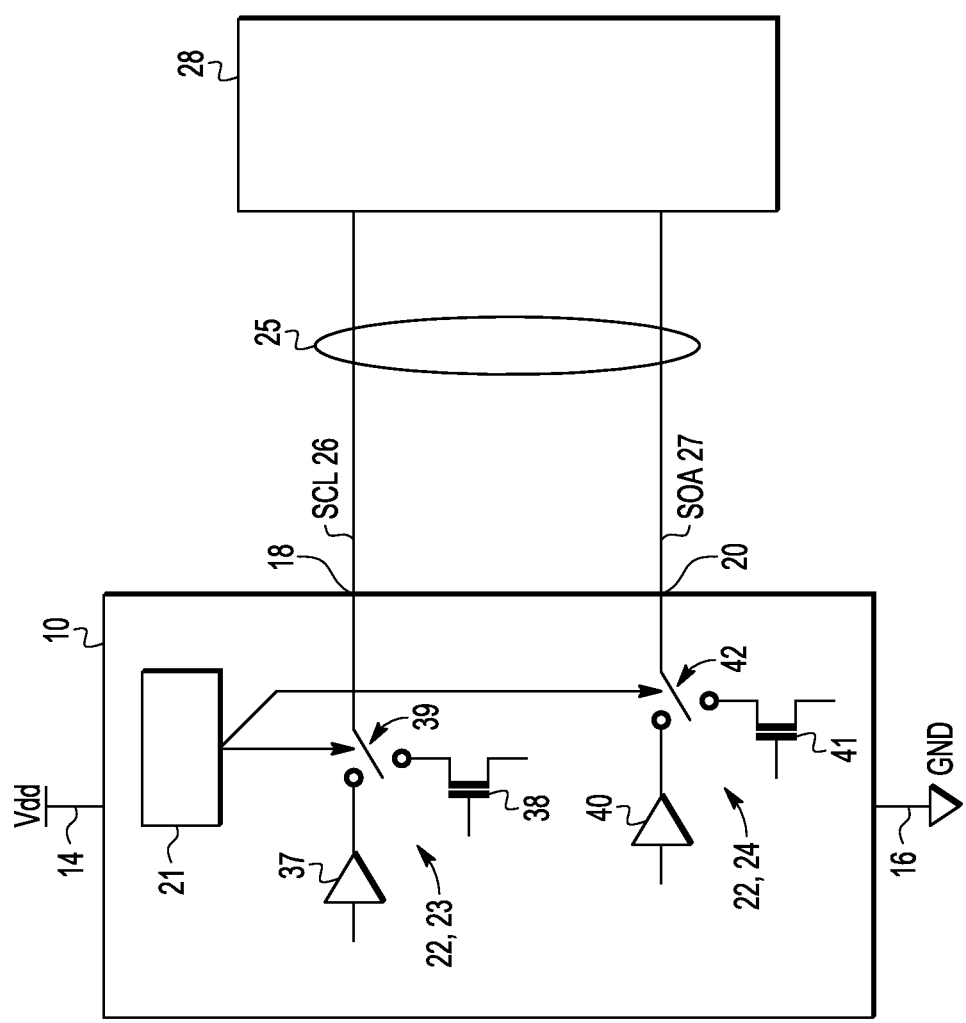
FIG. 1 is a diagram illustrating an embodiment of an integrated circuit having only a power pin, ground pin, and two communication pins, configured to operate in a test mode when connected to an automated testing equipment (ATE) unit.
Figure 2:
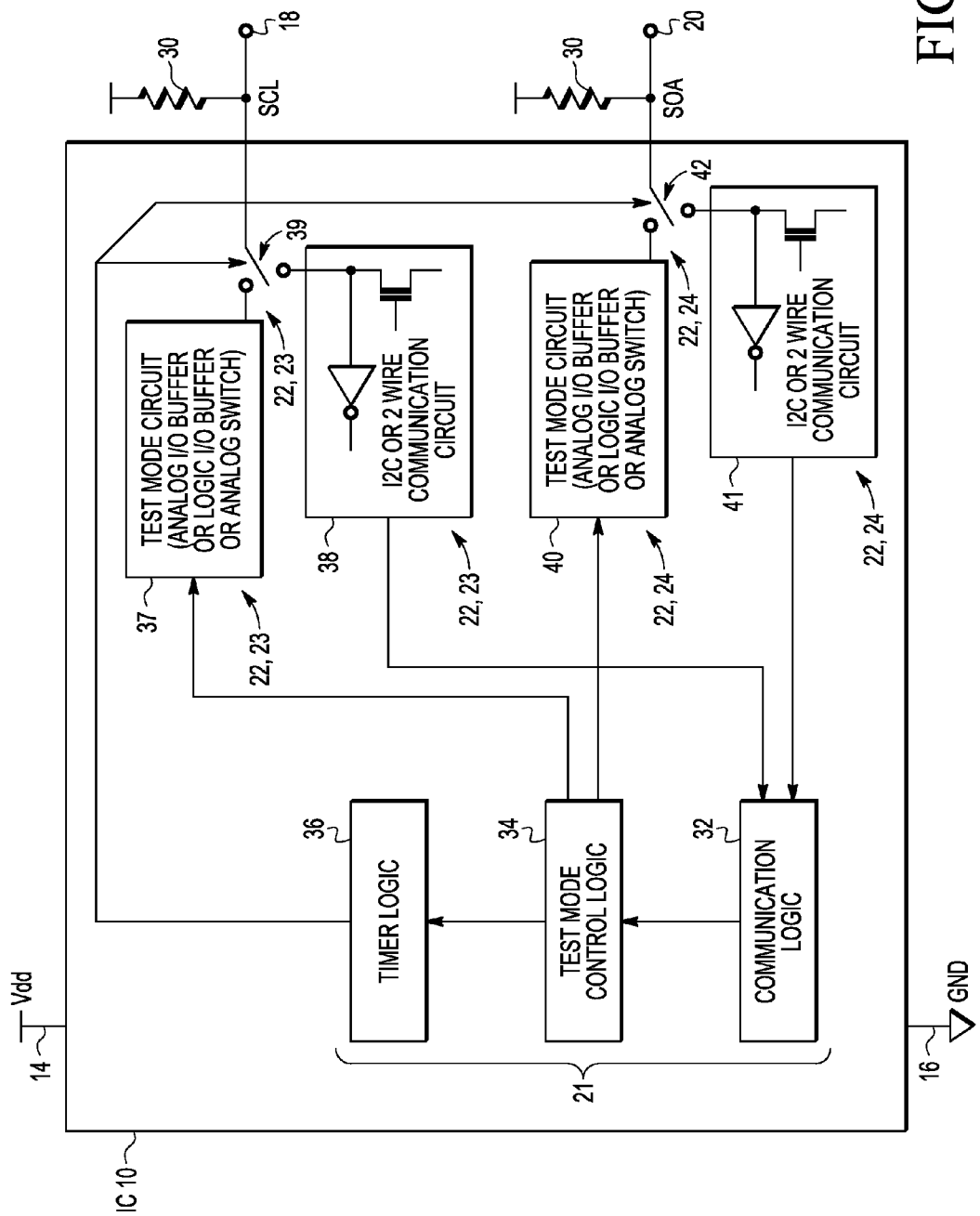
FIG. 2 is an additional schematic diagram illustrating in further detail the integrated circuit of FIG. 1, showing particularly logic and circuitry used to activate and deactivate a test mode of the integrated circuit.

Referring to FIGS. 1 and 2, first and second schematic diagrams are provided to show example components or features of an example four pin integrated circuit 10 in combination with (at least as shown in FIG. 1) an automatic testing equipment (ATE) unit 28. As described in further detail below, the integrated circuit 10 lacks any dedicated test pins and is configured to cooperate with the ATE unit 28 in the performing of a testing method in which the testing, and particularly test mode activation and deactivation, can be achieved without any such dedicated test pins. The integrated circuit 10 can be, but is not limited to, an application specific integrated circuit (ASIC) used in many different consumer electronic devices.

As shown in FIGS. 1 and 2, the four external pins (or connections) of the integrated circuit 10 in this embodiment include two power supply pins—namely, a power (Vdd) pin 14 and a ground pin 16—and additionally first and second communication pins 18 and 20, respectively. The integrated circuit 10 also includes internal logic 21 and circuitry 22 that provides for internal manipulation and routing of data or signals as is known in the art. It should be appreciated that the integrated circuit 10 also can include any of a variety of other circuit components not shown in FIGS. 1 and 2. Additionally, the integrated circuit 10 is shown in FIG. 1 to be connected to an automated test equipment (ATE) unit 28 by way of first and second communication pins 18 and 20, respectively, via a communication link 25, which can be considered a communication bus. Further, as shown in FIG. 2 in particular, in at least one embodiment, optional pull up resistors 30 are operably connected to each of the communication pins 18 and 20 so as to couple each of those pins to a power supply (e.g., to the same power supply to which the power pin 14 is coupled), and thereby to passively pull up the voltage at each of the communication pins 18 and 20 to the supply voltage.

Further with respect to the communication link 25, that communication link extends between the ATE unit 28 and the integrated circuit 10 and enables the integrated circuit 10 to transmit data to and receive data from the ATE unit (and/or possibly other devices). In a preferred embodiment, the communication link 25 operates by way of (or incorporates) the I2C (inter-integrated circuit) communication protocol (or simply the I2C protocol). As is known in the art, the I2C protocol is a two-wire digital interface having a serial data line (SDA) and a serial clock (SCL). Accordingly, as illustrated, the communication link 25 includes a first link 26 that is coupled to the first communication pin 18 and that represents the serial clock (SCL), and also includes a second link 27 that is coupled to the second communication pin 20 and that represents the serial data line (SDA). The I2C protocol allows for chip-to-chip digital communications using only two wires, and thus requires fewer external pins than a parallel interface. With the I2C protocol, the communication link 25 transmits addressing, selection, control, and data signals, one bit at a time between the ATE unit 28 and the integrated circuit 10.

The internal logic 21 of the integrated circuit 10 includes a communication logic block 32, a test mode control logic block 34, and a timer logic block 36. The circuitry 22 of the integrated circuit 10 includes first circuitry 23 that is coupled to the first communication pin 18 and second circuitry 24 that is coupled to the second communication pin 20. As shown particularly in FIG. 2, the first circuitry 23 includes a first analog test mode circuit 37, a first digital communication circuit 38, and a first switch 39, and similarly the second circuitry includes a second analog test mode circuit 40, a second digital communication circuit 41, and a second switch 42. In the present embodiment, the first and second digital communication circuits 38 and 41 are identical or substantially identical to one another, the first and second analog test mode circuits 37 and 40 are identical or substantially identical to one another, and the first and second switches 39 and 42 are identical or substantially identical to one another, albeit in other embodiments the circuits 37 and 40 can differ from one another, and/or the circuits 38 and 41 can differ from one another, and/or the circuits 39 and 42 can differ from one another. The switches 39 and 42 can be considered analog switches.

As shown in FIG. 1, generally speaking, the internal logic 21 communicates with and governs/controls the circuitry 22 and thus can be considered to constitute or include a control circuit or circuits (or control circuitry). More particularly as shown in FIG. 2, the switches 39 and 42 are connected to receive signals from, and are controlled by, the timer logic block 36. Based upon the signals received from the timer logic block 36, the first switch 39 can be operated to connect the first communication pin 18 in a selective manner to either the first analog test mode circuit 37 or to the first digital communication circuit 38. Also, based upon the signals received from the timer logic block 36, the second switch 42 can be operated to connect the second communication pin 20 in a selective manner to either the second analog test mode circuit or to the second digital communication circuit 41. In the present embodiment, each of the digital communication circuits 38 and 41 is comprised of standard inter-integrated circuitry, or other digital two-wire communication circuitry, and is connected to and configured to communicate signals to the communication logic block 32. Each of the first and second analog test mode circuits 37 and 40 includes a respective analog input/output (I/O) buffer, logic I/O buffer, or analog switch, and is connected to and configured to receive signals from the test mode control logic block 34. Such analog I/O or logic I/O buffers are configurable to store analog or discrete data sent to or from the ATE unit 28.

Generally, the ATE unit 28 can be configured to perform specific testing routines on an integrated circuit as directed by a user or controlling entity (e.g., a computer). These testing routines include sending (e.g., writing) test data, commands, and addresses to an integrated circuit being tested. The ATE unit 28 can also be configured to receive (e.g., read) test results, compare the received results with expected results, and to report whether a particular integrated circuit has passed or failed one or more of the testing routines. Although in conventional embodiments, integrated circuits can include one or more dedicated test pins by which the integrated circuits are intended to communicate with an ATE unit such as the ATE unit 28, in the present embodiment the integrated circuit 10 does not have any dedicated test pin or pins that are intended to be coupled to the ATE unit 28 for communication therewith. Instead, the integrated circuit 10 is configured to be operable in both a normal operating mode and also in a test mode. By virtue of being operable in both the normal operating and test modes, the integrated circuit 10 is capable of undergoing testing by way of the same pins, namely, the digital communication pins 18, 20, as are otherwise utilized by the integrated circuit 10 for normal operation in the normal operating mode. Thus, the present embodiment of the integrated circuit 10 eliminates the need for any dedicated test pins.

Figure 3:
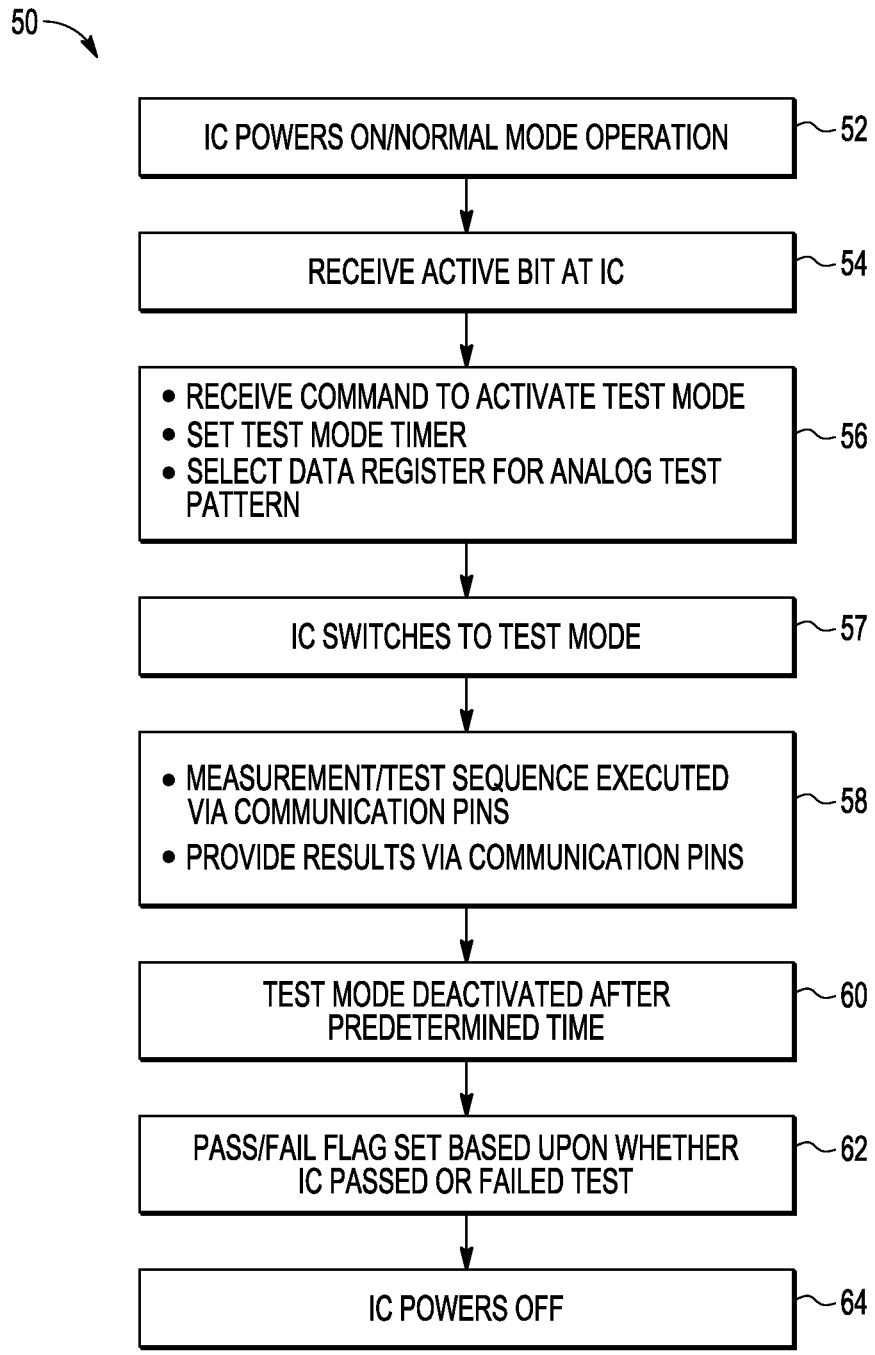
FIG. 3 is a flow chart illustrating a test mode activation, measurement procedure, and test mode deactivation sequence of operation of the integrated circuit of FIGS. 1 and 2.

Referring now also to FIG. 3, a flow chart 50 shows example steps of a process for activating and deactivating a test mode of the integrated circuit 10 by way of the ATE unit 28. Beginning at a step 52, the process commences with the ATE unit 28 pulling up the voltage on the power pin (Vdd) 14 such that the integrated circuit 10 powers on. When this occurs, the integrated circuit 10 is in a normal operating mode, in accordance with which the first and second communication pins 18 and 20 respectively are operably connected to the first and second digital communication circuits 38 and 41, respectively. Next, at a step 54, the integrated circuit 10 receives from the ATE unit 28 an active bit message, by way of the communication pins 18, 20. This active bit message is interpreted by the integrated circuit 10 as an instruction to prepare for test mode, and also this message is used to start enable the updating register so that the output starts updating (the active bit controls the internal circuitry ensuring updating of whatever is intended to be read). Then, at an activation step 56, the integrated circuit 10 additionally receives from the ATE unit 28 a command to activate the test mode of the integrated circuit 10. The command received by the integrated circuit 10 can be written to (or stored in), for example, a TEST_UNLOCK register of the integrated circuit 10, which can be included as part of the communication logic block 32 of FIG. 2. Additionally at the step 56, a test mode timer associated with the internal logic 21 of the integrated circuit 10 is set in response to the command from the ATE unit 28. Setting of the test mode timer can be achieved by writing a value to a timer register of the integrated circuit 10 (which can also be, for example, included in the communication logic block 32 or the time logic block 36). Further while still at step 56, a data register in the internal logic 21 of the integrated circuit 10 additionally is selected to be the location in which voltage signal values to be generated during the test mode of operation (e.g., in response to one or more voltage test signals received from the ATE unit 28) will be stored.

In response to these actions, the integrated circuit 10 transitions to the test mode, as represented by a block 57. More particularly, in order to transition into the test mode, the internal logic block 21 commands each of the switches 39 and 42 to disconnect the communication pins 18 and 20 respectively from the first and second digital communication circuits 38 and 41, respectively, and to connect the communication pins 18 and 20 respectively to the first and second analog test mode circuits 37 and 40, respectively. Then, at a step 58, while in test mode, the integrated circuit undergoes an analog measurement/test sequence during which the test signals are received from the ATE unit 28 via the communication pins 18 and 20. During the test mode, the communication pins 18 and 20 respectively remain operably connected to the first and second analog test mode circuits 37 and 40, respectively, and function exclusively as test pins. By virtue of these connections via the communication pins 18 and 20, the ATE unit 28 generates instructions and controls the steps of an analog measurement sequence, or test, on the integrated circuit 10. In at least some embodiments, one suitable analog procedure that can be used to test the integrated circuit 10 is a band-gap design block. Voltage values generated by the integrated circuit 10 in response to the analog test signals from the ATE unit 28 are stored in the analog I/O buffers of the test mode circuits 37 and 40 until those values can be read by the ATE unit 28.

Additionally, still while in the test mode corresponding to the step 58, the analog measurement sequence is completed and the ATE unit 28 then reads the voltage values stored in the analog I/O buffers of the first and second analog test mode circuits 37 and 40 via the communication pins 18 and 20, respectively. The ATE unit 28 in turn compares the measured voltage values with expected values and determines whether the integrated circuit 10 passed or failed the test. Notwithstanding the above discussion, it should be appreciated also that, in an alternative embodiment not shown, the generated analog voltage signals can be directed to built in self-test (BIST) logic within the integrated circuit 10 at which the signals are compared to expected values. In such an alternate embodiment, the results of the tests (e.g., 1=pass and 0=fail) can be transmitted to the ATE unit 28 using the I2C protocol string of bits (e.g., 0110 . . . ) with each bit representing the results of different tests. Such an alternative embodiment can require additional silicon in the integrated circuit 10 to create the BIST logic but can provide a faster process for testing the analog domain of the integrated circuit 10.

Further with respect to FIG. 3, the process is shown to advance from the step 58 to a step 60, at which the test mode is deactivated. In the present embodiment, the transition to the step 60 occurs upon the expiration of a time set by the test mode timer, regardless of whether the particular measurement/test sequence being performed at the step 58 has been completed. That is, at the step 60, the test mode timer (e.g., as implemented via the timer logic block 36) reaches the time set by the ATE unit 28 and the test mode of the integrated circuit 10 is deactivated by the internal logic 21. However, in alternate embodiments, the step 60 is only performed upon completion of the measurement/test sequence performed at the step 58 (as well as after the results have been provided via the communication pins as also set forth in the step 58).

During the transition from the test mode to the normal operating mode at the step 60, the timer logic block 36 commands the respective switches 39 and 42 to disconnect the respective communication pins 18 and 20 from the respective test mode circuits 37 and 40 and to reconnect the respective communication pins 18 and 20 back to the respective communication circuits 38 and 41. Further, at a next step 62, a pass/fail flag of the integrated circuit 10 is set based upon additional signal(s) provided by the ATE unit 28 upon the ATE unit determining whether the integrated circuit has passed or failed the test(s) of interest. Finally, at a concluding step 64, the integrated circuit 10 powers off when the ATE unit 28 releases the voltage on (allows the voltage to go down at) the power pin 14.

Figure 4:
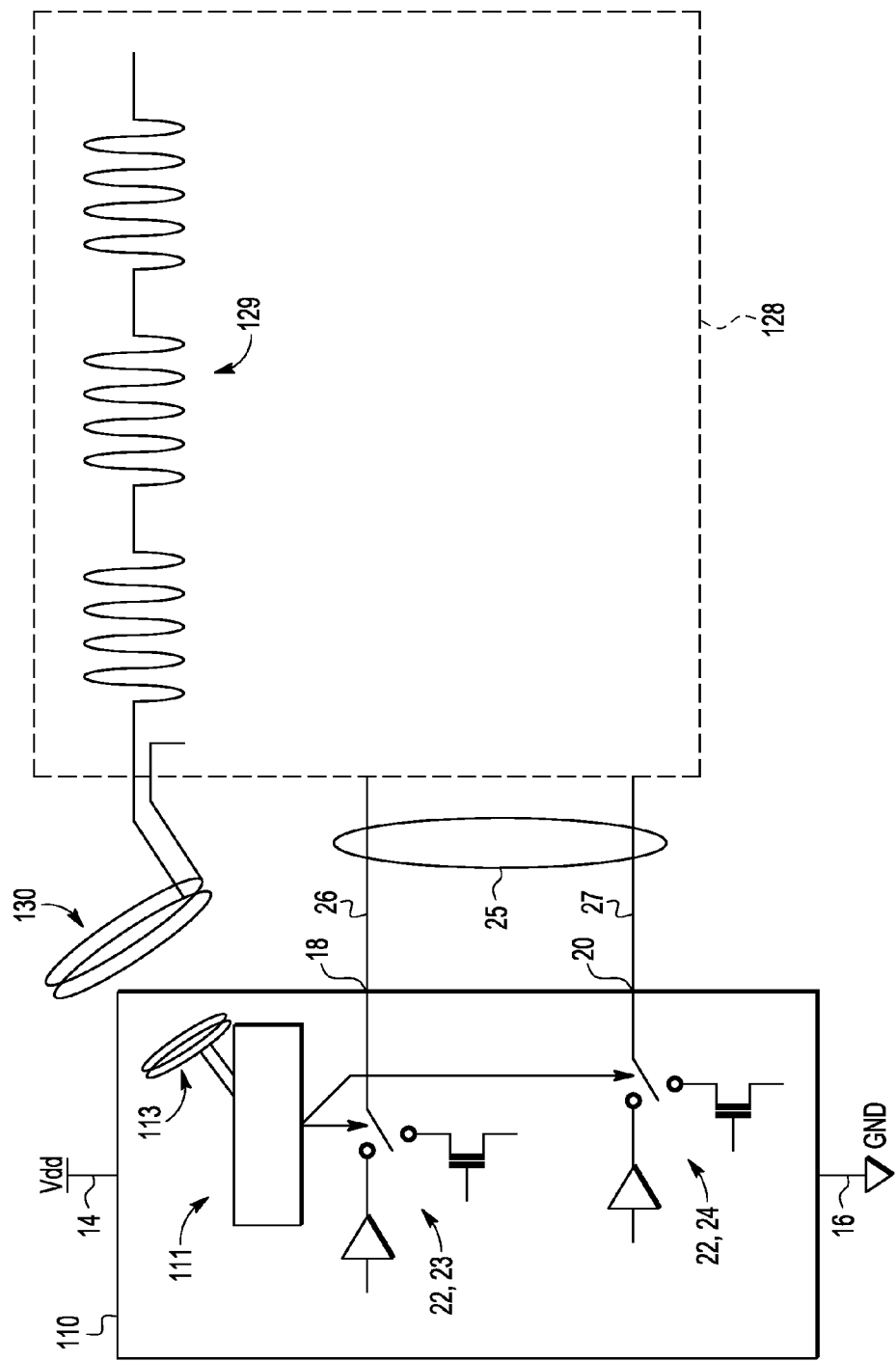
FIG. 4 is an alternative embodiment of the integrated circuit of FIGS. 1 and 2.

Notwithstanding the above description, the present disclosure is intended to encompass alternate embodiments, including alternate embodiments in which an integrated circuit can employ one or more communication pins as test pins under certain operational conditions but where one or more of test mode activation and test mode deactivation (e.g., switching from the normal mode to the test mode and/or vice-versa) is achieved in a manner different than that discussed above with respect to FIGS. 1, 2, and 3. For example, FIG. 4 illustrates a first example of a four pin integrated circuit 110 that, in accordance with one such alternate embodiment, is configured to allow for test mode operation without a dedicated test pin, where test mode activation and deactivation occur in a different manner than that described above with respect to the integrated circuit 10. In this alternate embodiment, the integrated circuit 110 again includes the communication pins 18 and 20 and circuitry 22, 23, and 24 (as well as the power pin 14 and ground pin 16) of the integrated circuit 10. However, rather than employing internal logic 21 including the timer logic block 36 (and associated test mode timer) as employed by the integrated circuit 10, the integrated circuit 110 instead employs internal circuitry 111 that particularly includes an RF detector 113 and corresponding logic (which can include logic corresponding to the test mode control logic block 34 and communication logic block 32 discussed above) for governing test mode activation and deactivation. Further with respect to the alternate embodiment of FIG. 4, it should be appreciated that an ATE unit 128 can activate the test mode of the integrated circuit 110 in the same manner as previously disclosed but in doing so does not set a test mode timer. Rather, the test mode is deactivated when a predetermined RF signal is detected by the RF detector 113. As illustrated, in the present embodiment it can be the ATE unit 128 itself that generates such a RF signal 129 and transmits the RF signal by way of a RF transmitter 130. Alternatively, the RF signal that is detected by the RF detector 113 can be generated by another RF signal source.

Therefore, it should be further appreciated that the process shown by the flow chart 50 of FIG. 3 is equally applicable to the integrated circuit 110 except insofar as the activation step 56 and test mode deactivation step 60 will be somewhat different than as described with respect to FIG. 3. More particularly, as already noted, no test mode timer exists for the integrated circuit 110. Consequently, although operation of the integrated circuit 110 also will include an activation step corresponding to the activation step 56 of FIG. 3, in this case the activation step will include the receiving of the command to activate the test mode and can also include the selecting of a data register for an analog test pattern as set forth in FIG. 3, but will not include any operation of setting any test mode timer. Further, with respect to the test mode deactivation step corresponding to the step 60 as described in relation to FIG. 3, in the case of the integrated circuit 110, deactivation will occur not in response to expiration of a timer but rather occurs because of receipt of an RF signal.

Figure 5:
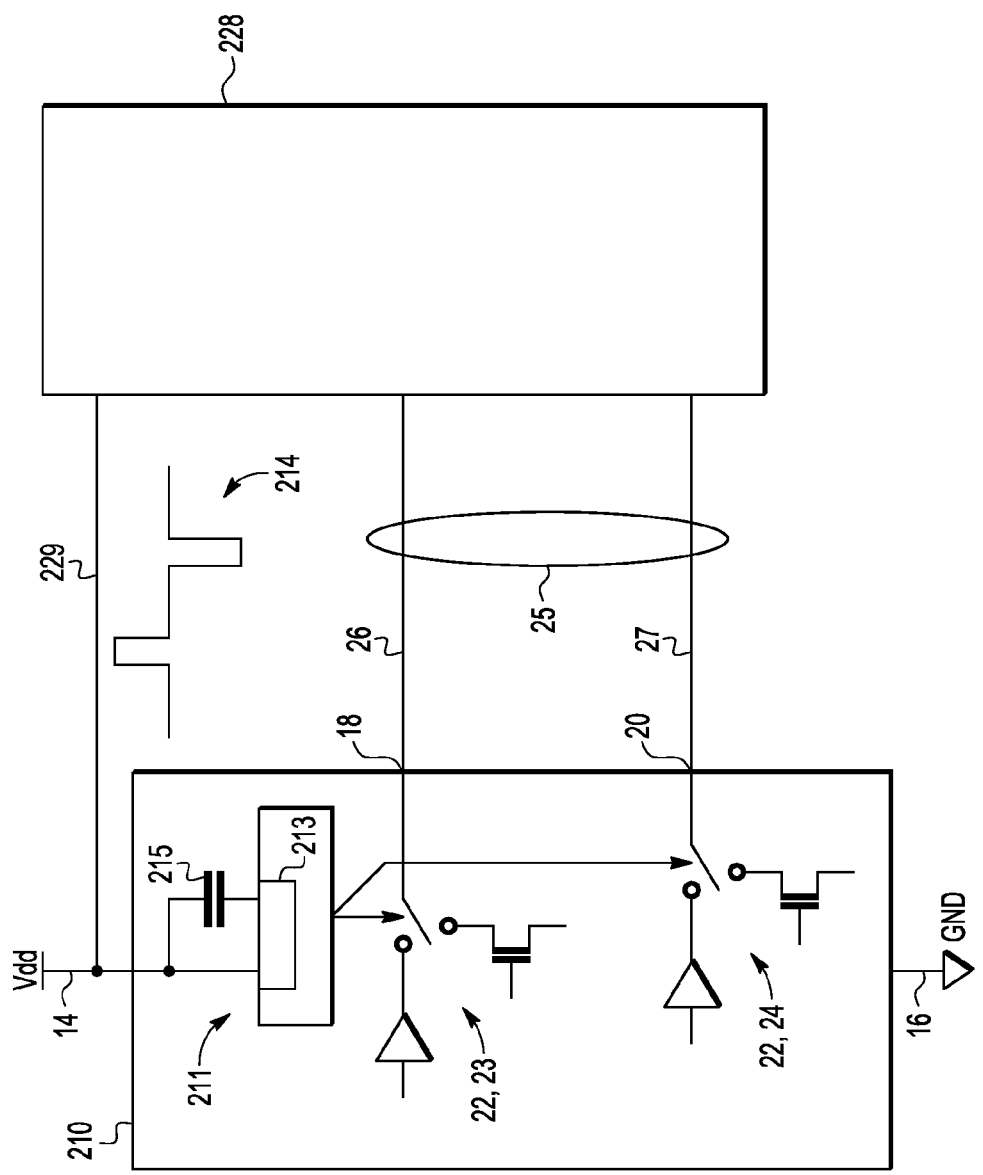
FIG. 5 is an additional alternative embodiment of the integrated circuit of FIGS. 1 and 2.

Turning to FIG. 5, an additional four pin integrated circuit 210 constituting a further alternate embodiment of the integrated circuit 10 is shown. In this embodiment, the integrated circuit 210 is configured to allow for test mode operation without a dedicated test pin, again where one or both of test mode activation and deactivation occur in a different manner than as performed by the integrated circuits 10 and 110. In this embodiment, the integrated circuit 210 again includes the communication pins 18 and 20 and circuitry 22, 23, and 24 (as well as the power pin 14 and ground pin 16) of the integrated circuit 10. However, rather than employing the internal logic 21 or the internal circuit 111, instead the integrated circuit 210 employs internal circuitry 211, which particularly includes a pulse detector 213, connecting circuitry 215 linking the pulse detector 213 to the power pin 14, and corresponding logic (which can include logic corresponding to the test mode control logic block 34 and communication logic block 32 discussed above). Further in this embodiment, the ATE unit 228 activates the test mode of the integrated circuit 210 in the same manner as previously disclosed but does not transmit a value to the test mode timer. Instead, the test mode is deactivated when a predetermined pulse or sequence of pulses 214 is applied to the power pin 14 and is detected by the pulse detector 213 via the connecting circuitry 215. Such a sequence of pulses can be supplied by the ATE unit 228 as shown in the present embodiment (with the ATE unit being coupled to the power pin 14 by way of a connection 229) or alternatively can be provided from another source.

Therefore, it should be further appreciated that the process shown by the flow chart 50 of FIG. 3 is equally applicable to the integrated circuit 210 except insofar as the activation step 56 and test mode deactivation step 60 will be somewhat different than as described with respect to FIG. 3. More particularly, as already noted, no test mode timer exists for the integrated circuit 210. Consequently, although operation of the integrated circuit 110 also will include an activation step corresponding to the activation step 56 of FIG. 3, in this case the activation step will include the receiving of the command to activate the test mode and can also include the selecting of a data register for an analog test pattern as set forth in FIG. 3, but will not include any operation of setting any test mode timer. Further, with respect to the test mode deactivation step corresponding to the step 60 as described in relation to FIG. 3, in the case of the integrated circuit 110, deactivation will occur not in response to expiration of a timer but rather occurs because of receipt of an appropriate pulse signal.

In one example embodiment encompassed herein, an integrated circuit includes a plurality of pins including a power pin, a ground pin, and a first communication pin. The integrated circuit further includes a first test mode circuit, a first communication circuit, and a first switch connected to the first communication pin, where the first switch is configured to couple the first communication pin to either the first test mode circuit or the first communication circuit, and where the first switch is configured so that the first communication pin can only be coupled to one of the first test mode circuit and the first communication circuit at a first time. The integrated circuit additionally includes a control circuit, coupled to the first switch, and configured to control whether the first switch is operated to couple the first communication pin to the first test mode circuit or to the first communication circuit based upon or in response to an operating mode of the integrated circuit.

Additionally, in another example embodiment encompassed herein, a method of testing an integrated circuit having a power pin, a ground pin, and a pair of communication pins includes receiving a test mode activation signal via at least one of the pair of communication pins, and first setting a plurality of switches after receiving the test mode activation signal to couple the pair of communication pins to test circuitry. The method additionally includes performing at least one test operation; and second setting the plurality of switches to couple the pair of communication pins to digital communication circuitry after the performing of the at least one test operation.

Further, in another example embodiment encompassed herein, an application specific integrated circuit includes a first power supply pin, a first communication pin, a first test mode circuit, and a first communication circuit. Additionally, the application specific integrated circuit includes a first switch coupled to the first communication pin, wherein the first switch is operable to selectively couple the first communication pin to the first test mode circuit and to the first communication circuit, and a logic block with an output connected to the first switch. The logic block is configured to couple the first communication pin to the test mode circuit after a test mode activation signal is received by the application specific integrated circuit, and the logic block is further configured to cause the first communication pin to subsequently proceed to couple the first communication pin to the first communication circuit upon the application specific integrated circuit either (a) determining that a first time period has expired or (b) receiving a trigger signal.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A method of testing an integrated circuit having a power pin, a ground pin, and a pair of communication pins, the method comprising:
receiving a test mode activation signal via at least one of the pair of communication pins;
first setting a plurality of switches after receiving the test mode activation signal to couple the pair of communication pins to test circuitry;
performing at least one test operation; and
second setting the plurality of switches to couple the pair of communication pins to digital communication circuitry after the performing of the at least one test operation.

2. The method of claim 1, further comprising:
receiving a test mode timer value via the communication pins, wherein the second setting of the plurality of switches occurs after a timer has reached the test mode timer value.

3. The method of claim 2, wherein the performing of the at least one test operation includes receiving at least one analog voltage test pattern on the communication pins while the communication pins are coupled to the test circuitry, which is analog test circuitry, and outputting at least one analog response to the at least one voltage test pattern via the communication pins; and
wherein the analog test circuitry includes an I/O buffer and the test mode activation signal is a digital test mode activation signal.

4. The method of claim 3, wherein the receiving and the outputting occur during a test mode of operation of the integrated circuit, and wherein the integrated circuit enters a normal mode of operation upon completion of the second setting.

5. The method of claim 1, further comprising:
detecting a RF signal, wherein the second setting of the plurality of switches occurs after the detecting of the RF signal.

6. The method of claim 1, further comprising:
detecting a pulse sequence on the power pin, wherein the second setting of the plurality of switches occurs after the detecting of the pulse sequence on the power pin.

7. The method of claim 1, wherein the integrated circuit comprises:
a plurality of pins including the power pin, the ground pin, and a first communication pin;
a first test mode circuit;
a first communication circuit;
a first switch connected to the first communication pin, wherein the first switch is configured to couple the first communication pin to either the first test mode circuit or the first communication circuit, wherein the first switch is configured so that the first communication pin can only be coupled to one of the first test mode circuit and the first communication circuit at a first time; and
a control circuit, coupled to the first switch, and configured to control whether the first switch is operated to couple the first communication pin to the first test mode circuit or to the first communication circuit based upon or in response to an operating mode of the integrated circuit.

8. The method of claim 7, wherein the control circuit of the integrated circuit is configured to enter a test mode of operation and to drive the first switch to couple the first communication pin to the first test mode circuit in response to a receiving of a test mode activation signal by the integrated circuit via the first communication pin.

9. The method of claim 8, wherein the integrated circuit further comprises a second communication pin, a second test mode circuit, a second communication circuit, and a second switch,
wherein the second switch is configured to couple the second communication pin to either the second test mode circuit or the second communication circuit, and the second switch is configured so that the second communication pin can only be coupled to one of the second test mode circuit and the second communication circuit at the first time or at a second time.

10. The method of claim 9, wherein the control circuit of integrated circuit is further configured to drive the second switch to couple the second communication pin to the second test mode circuit in response to receiving the test mode activation signal.

11. The method of claim 10, wherein at least one analog test signal is received by the integrated circuit via the first and second communication pins when the first and second communication pins are selectively coupled to the first and second test mode circuits, respectively.

12. The method of claim 11, wherein the control circuit of the integrated circuit comprises a timer, and the control circuit is configured to drive the first and second switches, respectively, to couple the first and second communication pins, respectively, to the first and second communication circuits, respectively, after the timer reaches a test mode time limit value.

13. The method of claim 11, wherein the control circuit of the integrated circuit includes a radio frequency (RF) detector, and the control circuit is further configured to drive the first and second switches to couple the first and second communication pins, respectively, to the first and second communication circuits, respectively, upon the RF detector detecting a RF signal.

14. The method of claim 11, wherein the control circuit of the integrated circuit includes a pulse detector, and the control circuit is configured to drive the first and second switches to couple the first and second communication pins, respectively, to the first and second communication circuits, respectively, upon the pulse detector detecting a pulse signal.

15. The method of claim 14, wherein the pulse signal is received via the power pin of the integrated circuit, and the plurality of pins only includes the power pin, the ground pin, and the first and second communication pins, and the integrated circuit does not include any dedicated test pin.

* * * * *